(12) United States Patent
Huang et al.

(10) Patent No.: US 6,250,941 B1
(45) Date of Patent: Jun. 26, 2001

(54) ZIF PGA SOCKET

(75) Inventors: Yao-Chi Huang, Yung-Ho; Chieh-Jung Huang, Tao-Yuan, both of (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/478,266

(22) Filed: Jan. 5, 2000

(30) Foreign Application Priority Data

Nov. 30, 1999 (TW) ................................................ 088220422

(51) Int. Cl.[7] .................................................. H01R 13/625
(52) U.S. Cl. ............................................................ 439/342
(58) Field of Search ............................. 439/342, 259–270

(56) References Cited

U.S. PATENT DOCUMENTS

| | | | |
|---|---|---|---|
| 4,420,205 | * | 12/1983 | Kirkman ................................ 439/342 |
| 4,538,870 | * | 9/1985 | Thewlis ................................. 439/342 |
| 5,649,836 | * | 7/1997 | Kashiwagi ............................ 439/342 |
| 5,707,247 | * | 1/1998 | Konstad ................................ 439/342 |
| 5,855,489 | * | 1/1999 | Walker .................................. 439/342 |
| 6,071,140 | * | 6/2000 | McHugh et al. ...................... 439/342 |

* cited by examiner

*Primary Examiner*—Gary F. Paumen
*Assistant Examiner*—Jim Harvey
(74) *Attorney, Agent, or Firm*—Wei Te Chung

(57) ABSTRACT

A ZIF PGA socket of the present invention comprises a base, a cover slidably mounted on the base, a plurality of electrical contacts mounted in the base, a ring insert molded in the cover, and a cam actuator partially received in the ring. The cam actuator comprises a lateral protrusion on an upper lateral side thereof for engaging with one of a pair of flushed stop surfaces on upper sections of the cover and of the ring to determine a respective stop position thereof. The cam actuator of the socket rotates when driven by an externally-applied force, thereby driving the cover slide along the base closing the engagement between the pins of a chip mounted on the cover and the contacts mounted in the base. The cam actuator is prevented from over-rotating by the lateral protrusion thereof abutting one of the pair of flushed stop surfaces. The contacts of the socket and pins of the inserted chip are thereby protected from damage.

1 Claim, 4 Drawing Sheets

ZIF PGA SOCKET

BACKGROUND OF THE INVENTION

1. Field of the Invention

The present invention relates to a ZIF (Zero Insertion Force) socket for use with a PGA (Pin Grid Array) chip, and particularly to a ZIF socket which includes a cam actuator.

2. Description of the Prior Art

A ZIF socket is often used to mount a PGA chip onto a printed circuit board (PCB). One example of such connectors comprises a base, a cover mounted onto the base, a plurality of electrical contacts received in the base, and an actuation mechanism including a ring and a cam actuator. The cover is actuated to slide diagonally on the base by rotation of the cam actuator in the ring, thereby causing the pins of the PGA chip in the cover to engage with the contacts in the base. However, the conventional cam actuator can be over rotated, which can cause damage to the contacts in the base and to the pins of the PGA chip. Further, an external tool used to urge the rotation of the cam actuator is apt to slide in untended direction, thereby resulting in damage of related components of the socket.

Therefore, an improved structure of the cam actuator is desired to overcome the disadvantages of the prior art

SUMMARY OF THE INVENTION

The major object of the present invention is to provide a ZIF PGA socket having a structure which eliminates over rotation of its cam actuator and sliding of its external tool in unintentional directions.

A socket in accordance with the present invention comprises a base, a cover slidably mounted onto the base, a ring insert molded in the cover, a cam actuator partially received in the ring, and a plurality of electrical contacts. The base comprises a first flange extending from a corner thereof, the first flange defining an elongated square hole extending through the base. The cover forms a corresponding second flange which cooperates with the first flange, and the second flange defines an aperture therethrough in alignment with the elongated square hole of the base. The ring is insert molded in the aperture of the second flange and has dimensions corresponding to the aperture. The cam actuator comprises an upper portion and a lower cam block. The upper portion comprises an upper disk and a lower disk. The axis of the upper portion and the cam block are offset from one another and the lower disk is received in the ring while the upper disk is supported by the ring. The cam block of the cam actuator extends through the elongated square hole of the first flange and comprises a riveting end riveted by a washer. The upper disk of the cam actuator forms an elongated groove in an upper surface thereof and a lateral protrusion extending from a lateral section thereof. The cam actuator rotates in the ring when an external torsional force is exerted thereon, such as that provided by a tool fitted into the elongated groove thereof. Rotation of the cam actuator is stopped when the lateral protrusion thereof abuts against flushed stop surfaces defined on the cover and on the ring.

Other objects, advantages and novel features of the invention will become more apparent from the following detailed description of the present embodiment when taken in conjunction with the accompanying drawings.

DETAILED DESCRIPTION OF THE INVENTION

Figure 1:
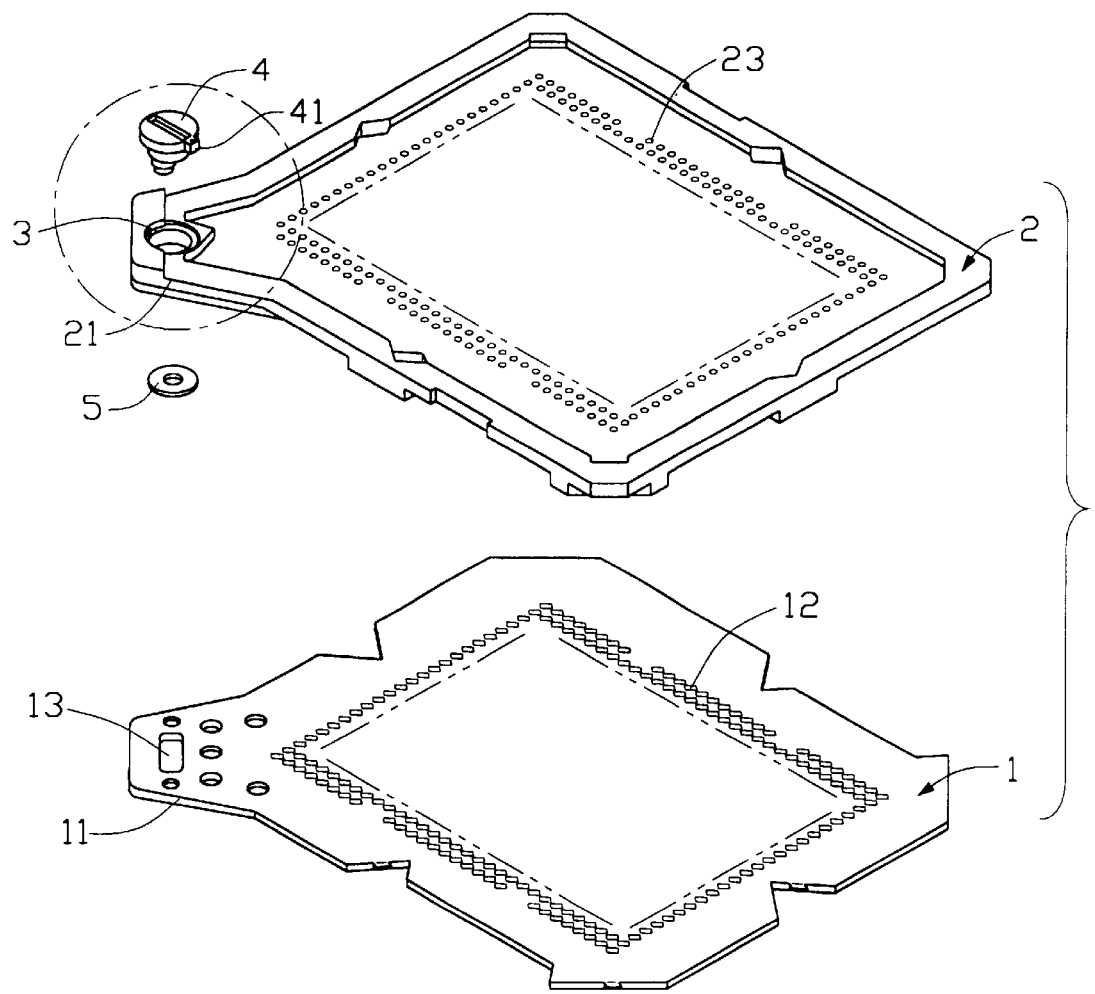
FIG. 1 is an exploded view of a ZIF PGA socket in accordance with the present invention.
Figure 2:
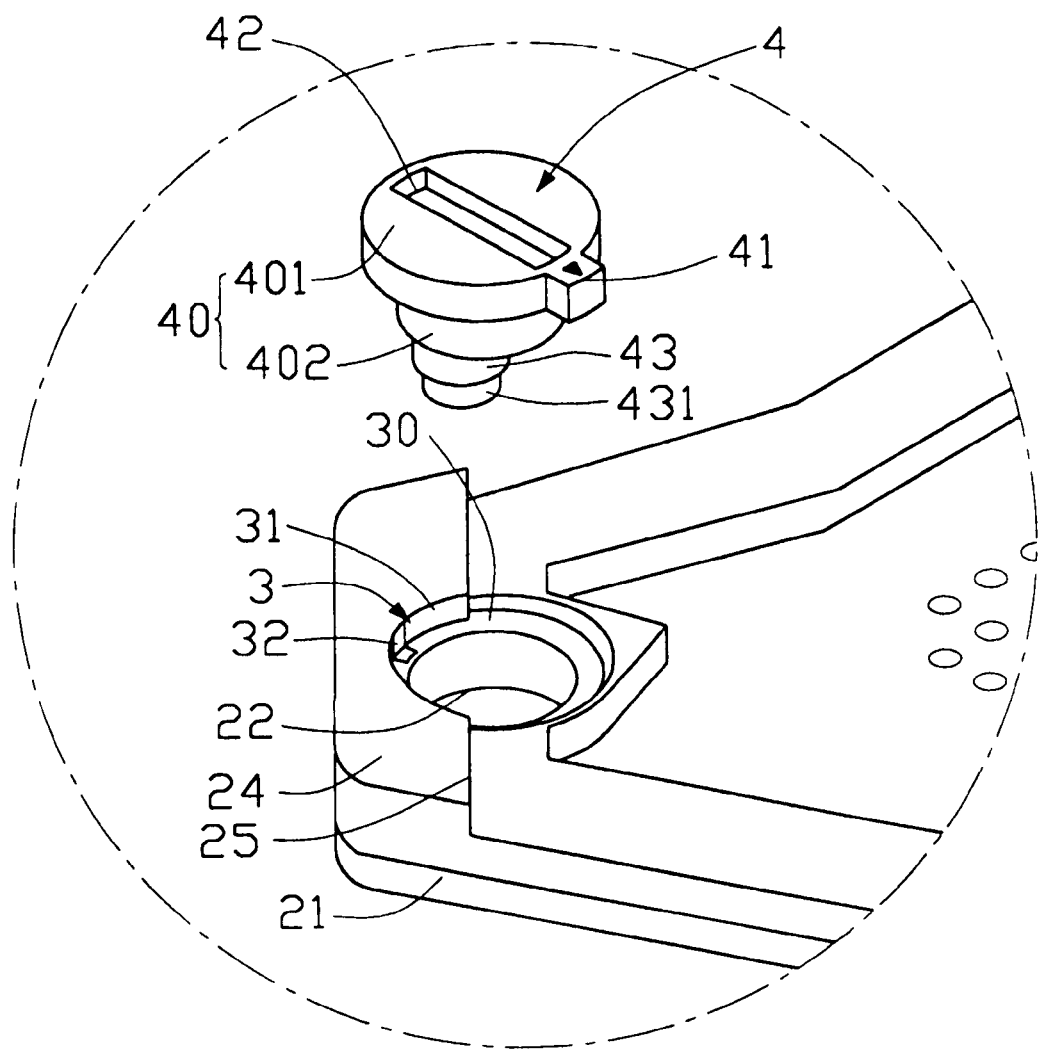
FIG. 2 is a partially enlarged view of FIG. 1.
Figure 3:
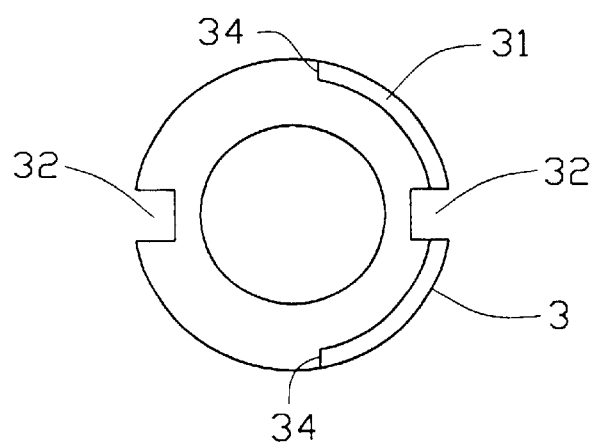
FIG. 3 is a top plan view of the ring of the ZIF PGA socket of FIG. 1.
Figure 4:
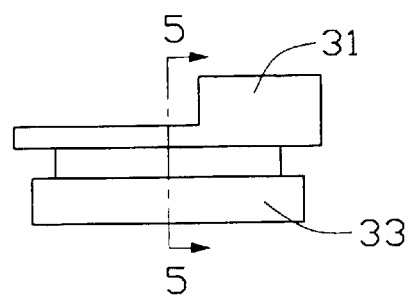
FIG. 4 is a side elevation view of the ring of the ZIF PGA socket of FIG. 1.
Figure 5:
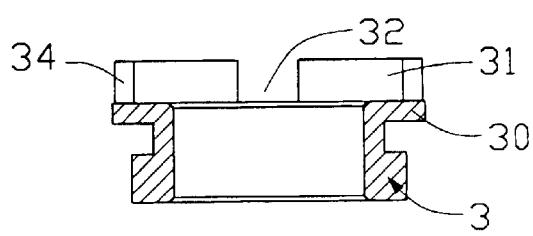
FIG. 5 is a cross sectional view taken from line 5—5 of FIG. 4.
Figure 6:
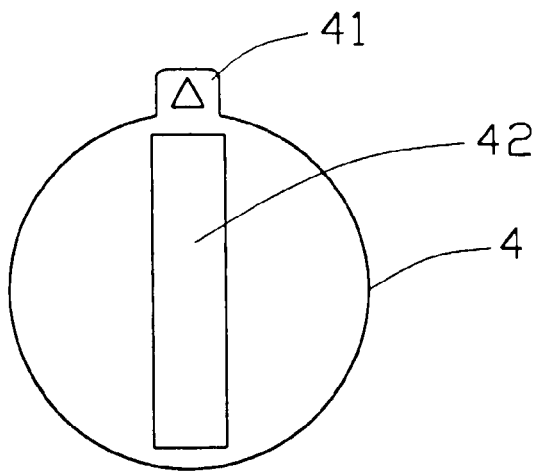
FIG. 6 is a top plan view of the cam actuator of the ZIF PGA socket of FIG. 1.
Figure 7:
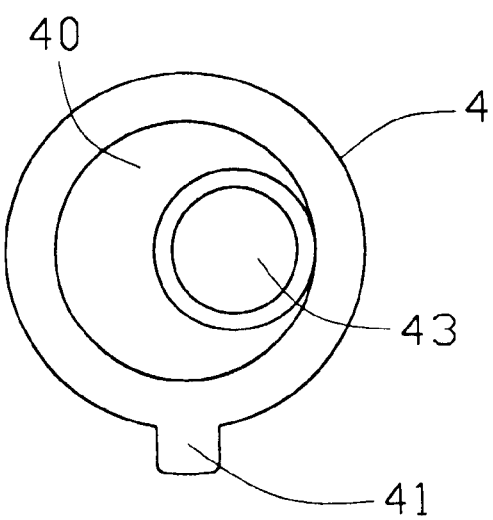
FIG. 7 is bottom plan view of the cam actuator of the ZIF PGA socket of FIG. 1.

Referring to FIGS. 1 to 7, a socket connector in accordance with the present invention comprises an insulative base 1, a dielectric cover 2, a ring 3 insert molded in the cover 2, a plurality of electrical contacts (not shown), and a cam actuator 4.

The base 1 is generally in the shape of a square and comprises a plurality of passageways 12 extending therethrough and a flange 11 extending from a corner thereof. The plurality of electrical contacts of the socket connector are received in the plurality of passageways 12, and the flange 11 defines an elongated square hole 13 therein.

The cover 2 has a shape corresponding to that of the base 1 and comprises a plurality of passages 23 extending therethrough and a flange 21 corresponding to the flange 11 of the base 1. The flange 21 defines an aperture 22 therethrough. The aperture 22 is generally circular in shape and has a stepped inner surface. A stop wall 24 is formed outside the aperture 22 and defines a pair of stop surfaces 25 on opposite sides thereof. The ring 3 is insert molded in the aperture 22 and has dimensions corresponding to the aperture 22.

The ring 3 comprises a bottom portion 33 interferentially engaging with the aperture 22, a support portion 30 and an upper circular stop wall 31. The ring 3 can be made of a metallic or another suitable material and defines a pair of symmetrically arranged cutouts 32 vertically therethrough for allowing an easier flow of plastic material during insert molding to enhance the retention between the aperture 22 and the ring 3. One cutout 32 extends through the circular stop wall 31. The circular stop wall 31 defines a pair of stop surfaces 34 on opposite ends thereof. The stop surfaces 34 are flush with the stop surfaces 25, respectively.

The cam actuator 4 comprises an upper portion 40 and a lower cam block 43. The upper portion 40 is composed of an upper disk 401 and a lower disk 402 coaxial with the upper disk 401. The upper disk 401 has a diameter larger than the lower disk 402 and substantially equal to the stop walls 24, 31. The upper disk 401 defines an elongated groove 42 recessed from the upper surface thereof and a lateral protrusion 41 protruding from a lateral side (not labeled) thereof. The elongated groove 42 is closed with a pair of walls (not labeled) on the opposite longitudinal ends thereof to confine an external tool (not shown) fitted thereinto therein and prevent the tool slide beyond the periphery of the upper surface of the upper disk 401. The cam block 43 is formed under the upper portion 40 and comprises a riveting end 431. The axis of the cam block 43 is parallel to but offset from the axis of the upper portion 40.

In assembly, the cover 2 is sidably mounted on the base 1 and the cam actuator 4 is inserted into the ring 3. The lower disk 402 is received by the passage (unlabeled) of the ring 3 and the support portion 30 of the ring 3 supports the upper disk 401 and permits rotation of the lateral protrusion 41 thereon. The cam block 43 of the cam actuator 4 extends into the elongated square hole 13 of the base 1 and the riveting end 431 is riveted using a washer 5 (see FIG. 1) on a lower surface of the base 1. The washer 5 is made of a metallic or other suitable material.

In operation, after a PGA chip (not shown) is loaded on the cover 2, the external tool (not shown) is fitted into the groove 42 to rotate the cam actuator 4 until the lateral protrusion 41 engages with one of the flushed stop surfaces 25, 34 of the cover 2 and of the ring 3. Since the axis of the cam block 43 is offset from the axis of the upper portion 40, the rotation of the cam actuator 4 forces the cover 2 to slide along the base 1 in a diagonal direction, thereby making the pins (not shown) of the PGA chip engage with the contacts (not shown) in the passageways 12. To open the pin-socket contacts connection, the cam actuator 4 is rotated in an opposite direction from the one flushed stop surfaces 25, 34 to the other flushed stop surfaces 25, 34 thereby disengaging the pins of the chip from the contacts of the socket and allowing the chip to be removed from the cover 2.

The ring 3 is insert molded in the cover 2, so the connection between the ring 3 and the cover 2 is reliable. The stop surfaces 25, 34 engage with the lateral protrusion 41 of the cam actuator 4 to stop rotation of the cam actuator 4, thereby avoiding over-rotation of the cam actuator 4 and safeguarding the contacts of the socket and the pins of the inserted chip from damage. The elongated groove 42 prevents the external tool from moving beyond the upper surface of the cam actuator 4 in horizontal directions and damaging the components of the socket adjacent thereto.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical socket comprising:

a base comprising a plurality of passageways extending vertically therethrough for receiving a corresponding number of electrical contacts therein and a flange extending from a corner thereof, the flange comprising a hole therethrough;

a cover slidably mounted on the base, the cover comprising a plurality of passages therethrough in alignment with the passageways of the base, respectively, and a flange positioned over the flange of the base, the flange defining an aperture in alignment with the hole of the base and a stop wall formed beside the aperture, the stop wall defining a pair of stop surfaces on opposite sides thereof; and an actuation mechanism comprising a ring insert molded in the aperture of the cover and a cam actuator rotatably retained with respect to the ring and extending into the hole of the base for actuating the cover to slide on the base, the cam actuator forming a lateral protrusion on an upper periphery thereof engageable with one of the pair of stop surfaces of the cover to determine a respective stop position thereof;

wherein the ring has a bottom portion to provide a reliable retention to the aperture;

wherein the ring comprises a pair of cutouts for preventing a rotational movement of the ring relative to the cover;

wherein the stop surfaces of the cover respectively correspond to a contacts-engaged and a contacts-disengaged position of the socket contacts with pins of a PGA chip;

wherein the cam actuator comprises a lower disk received in the ring, an upper disk supported by the ring, and a cam block received in the hole of the base;

wherein the upper disk of the cam actuator forms an elongated groove in a top surface thereof adapted for being operated by an external tool;

wherein the upper disk contains the lateral protrusion;

wherein the actuation mechanism comprises a washer, and the cam block comprises a riveting end for riveting the washer to the cam block;

wherein the elongated groove is close ended;

wherein the ring comprises a stop wall in an upper section thereof, the stop wall defining a pair of stop surfaces on opposite ends thereof flush with the stop surfaces of the cover, respectively.

* * * * *